United States Patent
Jiang et al.

(10) Patent No.: US 6,204,731 B1
(45) Date of Patent: Mar. 20, 2001

(54) POWER AMPLIFIER

(76) Inventors: Cao Jiang, Blk 474, #08-400, Jurong West St. 41, Singapore 620474 (SG); Wang Xinwei, Blk 718, #06-235, Yishun St. 71, singapore 760718 (SG); Hiroshi Nakamura, 20 Pine Grove, #13-05 Cavendish Park, Singapore 597595 (SG)

( * ) Notice: Subject to any disclaimer, the term of this patent is extended or adjusted under 35 U.S.C. 154(b) by 0 days.

(21) Appl. No.: 09/302,858

(22) Filed: Apr. 30, 1999

(30) Foreign Application Priority Data

Dec. 5, 1998 (SG) ................................................ 9804255-9

(51) Int. Cl.[7] ...................................................... H03F 3/04

(52) U.S. Cl. ...................................... 330/310; 330/124 R

(58) Field of Search ................................. 330/295, 296, 330/302, 310, 51, 124 R, 136

(56) References Cited

U.S. PATENT DOCUMENTS

| | | | |
|---|---|---|---|
| 5,420,541 | * 5/1995 | Upton et al. | 330/286 |
| 5,548,246 | 8/1996 | Yamamoto et al. | 330/51 |
| 5,635,870 | * 6/1997 | David | 330/52 |
| 5,949,287 | * 9/1999 | Kurusu et al. | 330/277 |
| 5,977,834 | * 11/1999 | Davis et al. | 330/302 |
| 6,091,966 | * 7/2000 | Meadows | 455/553 |
| 6,128,478 | * 10/2000 | Kim | 455/116 |

OTHER PUBLICATIONS

A GaAs Power Amplifier For 3.3 V CDMA/AMPS Dual–Mode Cellular Phones, By Sung–Jae Maeng, Soung–Soon Chun, Jong–Lam Lee, Chang–Seok Lee, Kwang–Jun Youn, and Hyung–Moo Park, IEEE Transactions on Microwave Theory and Techniques, vol. 43, No. 12, Dec. 1995.

Self–Linearizing Technique For L–Band HBT Power Amplier: Effect of Source Impedance on Phase Distortion By Hiroshi Yamada, Shiro Ohara, Taisuke Iwai, Yashuiro Yamaguchi, Kenji Imanishi, and Kazukiyo Joshin, IEEE Transactions on Microwave Theory and Techniques, vol. 44, No. 12, Dec. 1996.

(List continued on next page.)

*Primary Examiner*—Robert Pascal
*Assistant Examiner*—Henry Choe
(74) *Attorney, Agent, or Firm*—Oppenheimer Wolff & Donnelly LLP

(57) ABSTRACT

A power amplifier has an input terminal for receiving a signal to be amplified and an output terminal to which the amplified signal is passed, and comprises single stage which-, or a plurality of cascaded amplifier stages one of, which-, is formed from a plurality of amplifiers connected in parallel with their input ports interconnected and their output ports interconnected. Said one stage may be the last stage. In one arrangement said one stage comprises two or more amplifiers at least one of which is biased at class AB and at least another of which is biased at class C. Alternatively said one stage comprises two or more amplifiers at least one of which is biased at class AB and at least another of which may be switchably biased at class AB or class C.

Again, alternatively, the said one stage may comprise two or more amplifiers, each of which may be switchably biased at class AB or class C and the gates widths of which may be different. The amplifier stages may comprise bipolar junction transistors or field effect transistors. Means are preferably provided enabling the power to be divided to the input to each amplifier in said one stage and means enabling the outputs of each of said amplifiers to be combined. There may be provided between the power dividing point to the input of each of said amplifiers a matching circuit enabling phase shifting to compensate for the amplitude and phase response of each of said amplifiers. In said one stage there may be provided between the output ports of each of said amplifiers and the combining point a matching circuit enabling phase shifting to compensate for the amplitude and phase response of each of said amplifiers.

32 Claims, 2 Drawing Sheets

OTHER PUBLICATIONS 3.5 V Operation Driver–Amplifier MMIC Utilizing $SrTiO_3$ Capacitors For 1.95 GHz Wide–Band CDMA Cellular Phones By T. B. Nishimura, N. Iwata, K. Yamaguchi, K. Takemura, and Y. Miyasaka, 1998 IEEE MTT–S Digest.

Intelligent RF Power Module Using Automatic Bias Control (ABC) System for PCS CDMA Applications By Tetsuo Sato, Shigehiro Yuyama, Akishige Nakajima, and Hideyuki Ono, 1998 IEEE MTT–S Digest.

* cited by examiner

POWER AMPLIFIER

FIELD OF THE INVENTION

The invention relates to power amplifiers, more particularly, but not exclusively, to power amplifiers used in portable telephones used in cellular telephone systems.

BACKGROUND OF THE INVENTION

Current digital mobile communications systems require RF power amplifiers in the handset transmitter to have high efficiency; linearity not only at high output levels but also at low output levels. These stringent requirements arise from the need of the cellular system and to further increase the system transmission data rates and to expand the capacity.

In a portable handset for use in such system, a two or three stage power amplifier is normally used to power the transmitter—which is essential to determine the talk time and the size of the handset. In order to ensure that the battery lasts as long as possible in such a handset it is important to ensure that power consumption is minimised.

It is known that in a portable handset the power supply in the transmitter consumes 70%–80% of the battery power. It is evident therefore that a high efficiency power amplifier is important if the power consumption of the handset is to be reduced.

Normally a high output power is required for the power amplifier in the handset if the handset is at a position remote from the base station. However, the handsets will be often sufficiently close to a base section to allow operation of the amplifier at a medium or low output power level.

It is also important to maintain as high as possible the power and efficiency (PAE) for the amplifier at low and medium output levels. Again the higher linearity is required of the amplifier to reduce adjacent channel power (ACP) leakage over the whole power range—especially at high power levels.

There are contradictions in the way one achieves linearity, power and efficiency in a power amplifier design. If high linearity is required for a power amplifier it is usual to bias the amplifier at a high quiescent current such as class A. The efficiency therefore becomes low compared with class B or class C amplifiers. However, if a power amplifier is biased at a low quiescent current high efficiency for the amplifier can be achieved but the linearity of the device falls. It is usual in power amplifier design to make a trade off between efficiency, linearity and output power in conjunction with the biasing point, matching circuits and the like.

Various suggestions have been made (see bibliography and end of description)

To increase the PAE at low and high output power levels some have proposed a scheme with switch circuits. In this scheme the switch circuit and one or more amplifier circuits are introduced to improve amplifier efficiency. The first amplifier circuit is designed to achieve a high PAE at high output power levels whilst the second amplifier is designed for high PAE at low output power levels. Thus at different power levels different power amplifiers are used to amplify the input signal. Therefore the amplifier can obtain high PAE at low output power levels but unfortunately it cannot improve the linearity of the power amplifier at high output power levels.

Another approach to increase the efficiency was suggested earlier (see Sato). In this scheme the gate voltage of the amplifier is varied according to the output power levels. At low output power levels, bias current for the power amplifier is named to low to achieve high efficiency. At high output power levels bias current for the power amplifier is adjusted high to achieve high linearity. Unfortunately the power sensor and bias control circuits are required to realise the bias control function which again increases complexity of the power amplifier.

SUMMARY OF THE INVENTION

It is an object of the present invention to provide a power amplifier which meets the above noted requirements whilst being significantly simpler than the proposals made so far.

In one aspect the invention provides a power amplifier having an input terminal for receiving a signal to be amplified and an output terminal to which the amplified signal is passed, the power amplifier comprising a plurality of cascaded amplifier stages one of which comprises a plurality of amplifiers connected in parallel with their input ports interconnected and their output ports interconnected.

Said one stage may be the last stage in said plurality of cascaded stages.

Said one stage may comprise two or more amplifiers at least one of which is biased at class AB and at least another of which is biased at class C.

In this arrangement when the power level of the input signal is low the class AB amplifier alone is operational and when the power level of the input signal becomes high both the class AB and class C amplifiers are operational.

Alternatively said one stage comprises two or more amplifiers at least one of which is biased at class AB and at least another of may be switchably biased at class AB or class C.

It is envisaged that the amplifier with switchable bias is biased at class C when the power level of the input signal is low and at class AB when the power level of the input signal is high.

Again, alternatively, the said one stage may comprise two or more amplifiers, each of which may be switchably biased at class AB or class C and the gates widths of which may be different.

In this arrangement one of the amplifiers comprising an FET with a smaller gate width may be biased at class AB whilst the others are biased at class C when the input power level is low and one of the amplifiers of larger gate width may be biased at class AB whilst the others are biased at class C when the input power level is medium, and all of the amplifiers biased at class AB when the input level is high.

The amplifier stages may comprise bipolar junction transistors or field effect transistors.

Means are preferably provided enabling the power to be divided to the input to each amplifier in said one stage and means enabling the outputs of each of said amplifiers to be combined.

There may be provided between the power dividing point to the input of each of said amplifiers a matching circuit enabling phase shifting to compensate for the amplitude and phase response of each of said amplifiers.

In said one stage there may be provided between the output ports of each of said amplifiers and the combining point a matching circuit enabling phase shifting to compensate for the amplitude and phase response of each of said amplifiers.

In another aspect the invention provides a power amplifier having an input terminal for receiving a signal to be amplified and an output terminal to which the amplified signal is passed, and which comprises a plurality of amplifiers connected in parallel with their input ports interconnected and their output ports interconnected.

There may be provided two or more amplifiers at least one of which is biased at class AB and at least another of which is biased at class C.

It may be arranged such that when the power level of the input signal is low the class AB amplifier alone is operational and when the power level of the input signal becomes high both the class AB and class C amplifiers are operational.

There may be provided two or more amplifiers at least one of which is biased at class AB and at least another of may be switchably biased at class AB or class C.

It may be arranged such that the amplifier with switchable bias is biased at class C when the power level of the input signal is low, and at class AB when the power level of the input signal is high.

There may be provided two or more amplifiers each of which may be switchably biased at class AB or class C and the gates widths of which are different.

It may be arranged such that the FET with a smaller gate width is biased at class AB and the other at class C when the input power is low, but the amplifier who's FET with a wider gate is biased at class AB and the other are biased at class C when the input power level is medium and in which all the amplifiers are biased to class AB when the input power level is HIGH Preferably, the amplifiers comprise different threshold voltage field effect transistors having the same gate bias voltages.

The amplifiers may be formed of bipolar junction transistors or field effect transistors.

Means may be provided enabling the power to be divided to the input to each amplifier and means enabling the outputs of each of said amplifiers to be combined. There may be provided between the power dividing point to the input of each of said amplifiers a matching circuit enabling phase shifting to compensate for the amplitude and phase response of each of said amplifiers.

There may be provided between the output ports of each of said amplifiers and the combining point a matching circuit enabling phase shifting to compensate for the amplitude and phase response of each of said amplifiers.

BRIEF DESCRIPTION OF THE DRAWING

The above aspects, features and advantages of the present invention will become apparent from the following description of an embodiment now made with reference to the accompanying drawings in which.

DESCRIPTION OF THE PREFERRED EMBODIMENT

With reference now to the drawings. The power amplifier shown in FIG. 1 has an input terminal IN connected through an input matching circuit M1 to a first amplification stage A1 of the amplifier. The output of first stage A1 is connected via an interstage matching circuit M12 to a second amplification stage A2. The output of the second stage A2 is connected through an interstage connecting circuit M23 to a final amplification stage A3. The output of the final stage A3 is connected through an output matching circuit M3 to the output port of the power amplifier.

Figure 1:
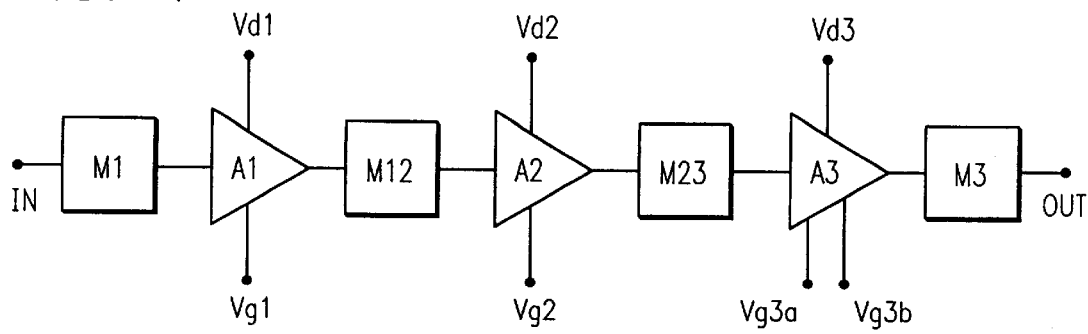
FIG. 1 is a schematic block diagram of a power amplifier embodying the present invention.
Figure 2:
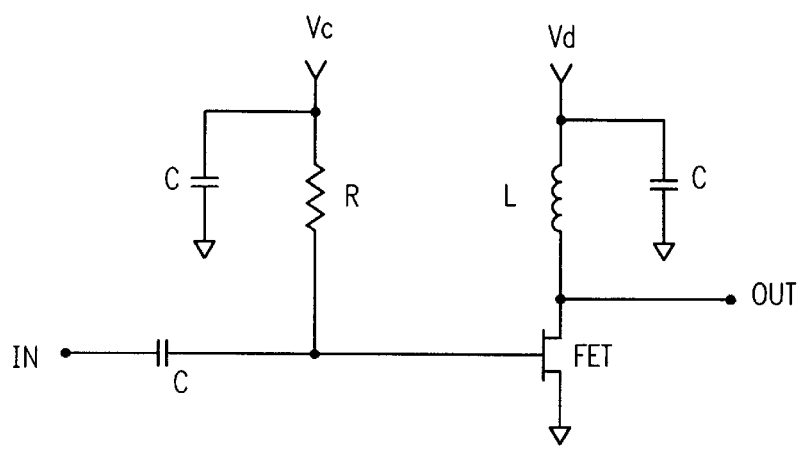
FIG. 2 is a schematic circuit diagram of a first or second stage of the power amplifer shown in FIG. 1.

As can be more clearly seen from FIG. 2 the first and second stages of the amplifier shown in FIG. 1 comprise FETs biased at gate voltages $Vg1$, $Vg2$ and a drain voltages $Vd1$ and $Vd2$ respectively.

It is to be noted however that the final stage A3 of the power amplifier has to gate bias supplies $Vg3A$, $Vg3B$ separately for the two FET's which are included in it. The third stage A3 of the power amplifier has one drain bias supply $Vd3$ for both of the FET's included in it.

The first and second stages of the amplifiers, A1 and A2, or operated as class AB amplifiers. Their quiescent currents are set to 5–10% of the saturated current of the FET therein.

Figure 3:
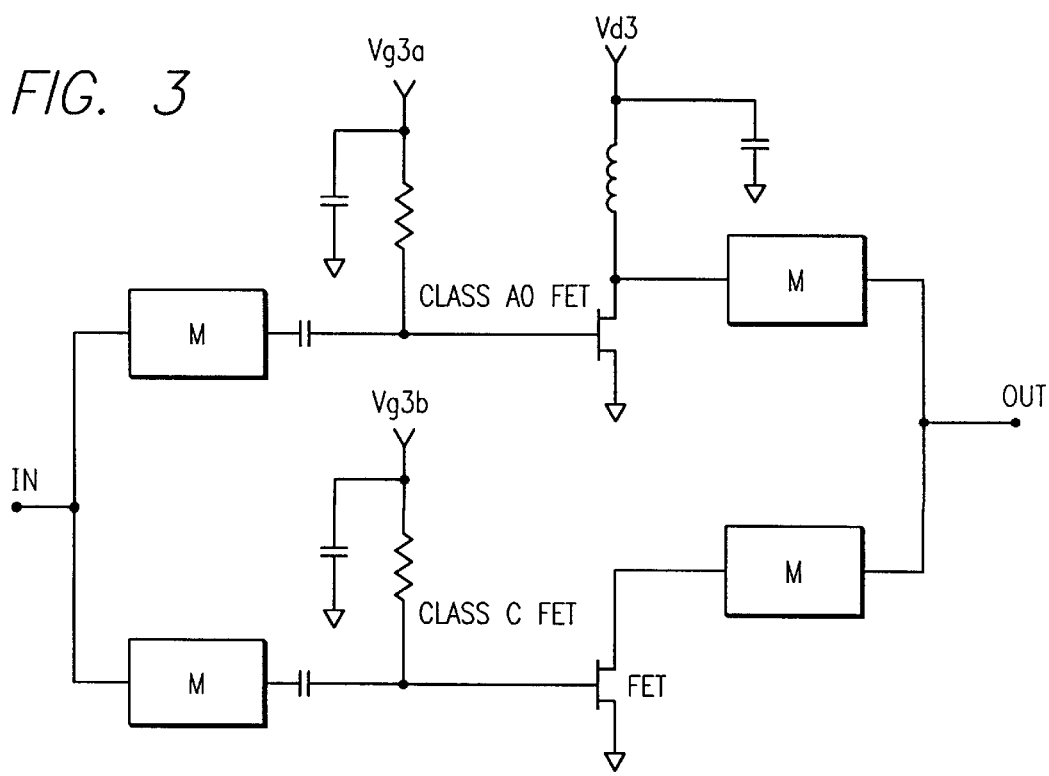
FIG. 3 is a schematic circuit diagram of the third stage of the power amplifier shown in FIG. 1.

The final stage comprises two FET's in parallel, as can be clearly seen from FIG. 3. One FET is biased at a typical class AB region with a quiescent current of approximately 5–10% of the saturated current of the FET whilst the other FET is biased at class C where the quiescent current is approximately equal to zero.

Matching circuits M are parallel as shown between the power dividing point and the inputs to the amplifiers to allow for compensation of the amplification and phase response of the amplifiers. Again matching circuits M are provided between the outputs of the amplifiers and the point at which the outputs are combined to allow for compensation for the amplitude and phase response of each of the amplifiers. This particular formation of power amplifier gives rise to a number of improvements.

In particular, there is an improvement to the power added efficiency at lower power levels. At low output power levels the output of the second stage A2 of the power amplifier is insufficiently high to turn ON the class C FET in the third stage A3 of the power amplifier. In that condition, the class AB FET in the third stage A3 is operational and the class C FET is turned OFF.

As there is no quiescent, current for the class C FET at low output power levels the total current consumption of the amplifier stage A3 is reduced to the level of the class AB FET consumption. AS a result higher efficiency of the power amplifier can be obtained at low output power levels. When the power amplifier shown in FIG. 1 operates at high output power levels the output levels of the second stage of the amplifier A2, will turn ON the class C FET. At low and medium power levels, the class C FET has not completely turned on so the gain of the class C FET is very low. The main contribution to the total gain of the amplifier comes from the class AB FET and the total current consumption is determined by the class AB FET. When the power level reaches a certain level—near to saturation the gain of the class AB FET—begins to compress. However, at the same time, the class C FET is driven to work with the increased input power.

With the arrangement shown in FIGS. 1 to 3 it is possible to design the bias point, the width of the gate of the FET and matching circuit such that the class AB and class C FET's in amplifier stage A3 compensate one for the other. In this way the total gain can be maintained at higher power level. In this way the power compression point of the amplifier is pushed up to a higher output power level which improves the linearity at higher output power levels.

An embodiment of the invention has been applied to the design of a three stage 1.9 GHz CDMA power amplifier based on GaAs MMIC Technology. The design specification for the power amplifier is shown in table 1.

TABLE 1

| Item | Symbol | Test Condition | | Specifcation | | Unit |
|---|---|---|---|---|---|---|
| | | | Min | Typ | Max | |
| Output Power | Po | ACPR(±1.25 MHz) <=45 dBc | 25 | | | dBm |
| Linear Grain | Gt | Pin - 10 dBm | | 30 | | dB |
| Drain Current | Id tot | Vdd = 3.6 V   Po = 29 | | 550 | 600 | mA |
| | | Po = 15 | | 120 | 150 | mA |
| | | Po = 5 | | 70 | 100 | mA |

It is often very difficult to achieve linearity at high output power with high efficiency and higher and lower output power for an amplifier.

A simulated comparison was made with an amplifier such as for example shown in FIG. 1 against a 3 stage CDMA power amplifier in which each of the stages comprises a class AB amplifier.

Simulations have shown that the class AB plus C amplifier has significant performance and advantages over the more conventional class AB amplifiers, such as are listed in table 2.

TABLE 2

| Item | Test Condition | | Class AB + C Amp | Class AB Amp |
|---|---|---|---|---|
| Output Power | ACPR (± 1.25 MHz) = 45 dBc | | 31.0 dBm | 28.8 dBm |
| Linear | Pin = 10 dBm | | 32 dB | 36 dBm |
| Drain Current | Vdd = 3.6 V | Po = 29 dBm | 560 mA | 553 mA |
| | | Po = 15 dBm | 130 mA | 240 mA |
| | | Po = 5 dBm | 100 mA | 150 mA |

Figure 4:
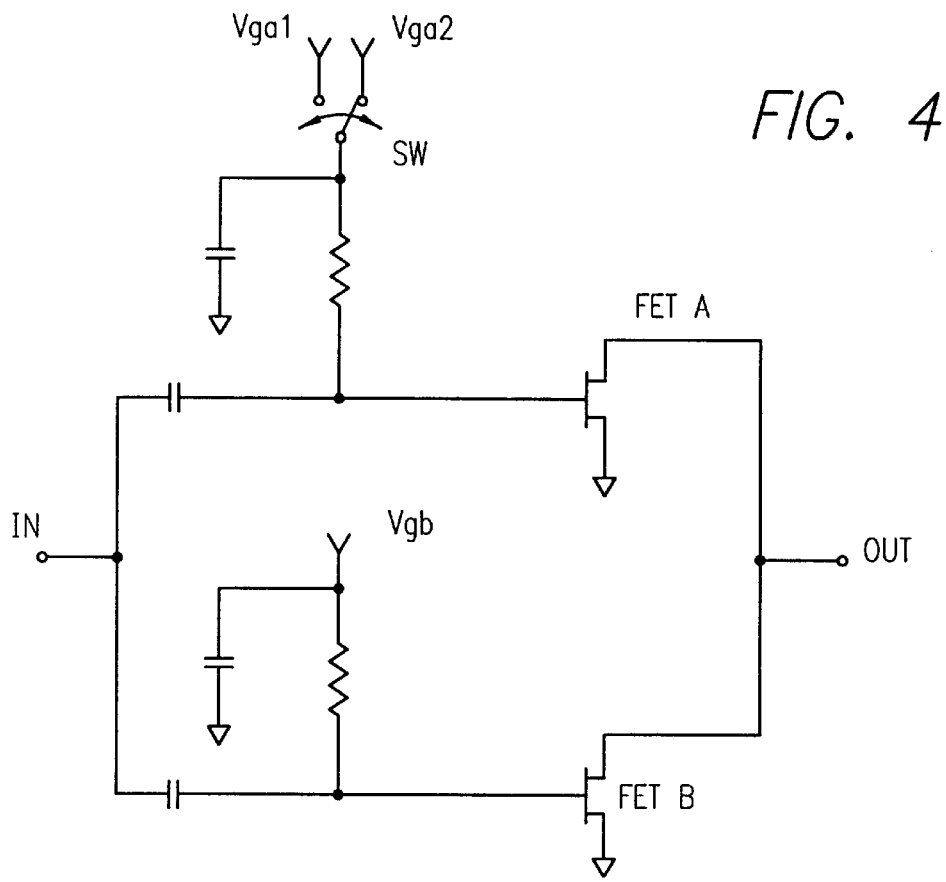
FIG. 4 is a schematic circuit diagram of another form of the third stage of the amplifier shown in FIG. 1.

FIG. 4 illustrates an alternative form of the third stage of the amplifier falling within the scope of the present invention. As the Figure shows this amplifier stage comprises two (or more) FET's in parallel. FET B is biased at class AB whilst the bias for FET A can be switched from Vga1 to Vga2 (and vice versa) by a switch SW. Vga1 is selected to bias FET A at class AB and Vga2 to bias FET at class C. When the input power is low the switch, SW is set to Vga2. In this condition FET A works at class A. As the output power is insufficiently high to turn the class C FET ON only the class AB FET is operational. The class C FET is at an OFF state at low power output levels. It will be appreciated that at this time there is no current consumption for class C FET at low power output levels and the total power consumption for the amplifier stage is reduced to the level of the class AB FET current consumption.

As a result of this a higher efficiency for the amplifier stage can be obtained at low output power levels.

When the power level of the input signal is HIGH the switch SW is set to Vga2. At this time FET A works at class AB. At this moment the amplifier works as a conventional AB amplifier.

Figure 5:
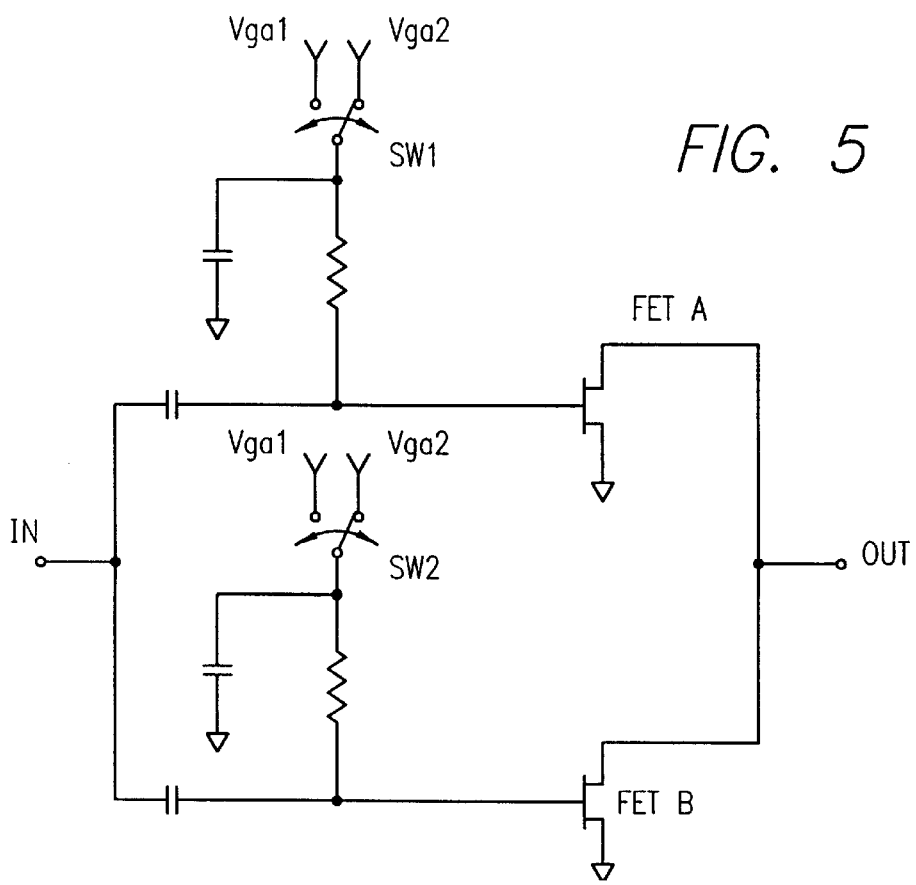
FIG. 5 is a schematic circuit diagram of yet another form of the third stage of the amplifier shown in FIG. 1.

Another alternative form of the amplifier stage as shown in FIG. 5 in which the amplifier stage comprises two (or more) FET's in parallel. The bias for FET A can be switched from Vga1 to Vga2 (and vice versa) by a switch. Vga1 is selected to bias FET A to operate at class AB and Vga2 is selected to bias FET A to operate at class C.

The bias for FET A can also be switched from Vgb1 to Vgb2 (or vice versa) by a second switch SW2. Vgb1 is selected to make FET B operate at class AB whilst Vgb2 biases FET B to operate at class C.

The total gate width of FET A is different from that of FET B. It may be assumed for example that the gate width of FET A is larger than that of FET B.

Normally an amplifier biased at higher quiescent current can achieve better linearity than one biased at lower quiescent current. However the efficiency may be poorer. A larger gate width FET has better linearity and power capability at higher power levels than an FET with a smaller gate width.

It will be appreciated that in the arrangement disclosed with reference to FIG. 5 it is possible to select between the different configurations to achieve a compromise performance between linearity and efficiency at different power levels as shown in Table 3.

TABLE 3

| Input power | Switch Setup | FET A | FET B | Performance |
|---|---|---|---|---|
| Low | SW1: Vga2 SW2: Vgb1 | Class C | Class AB | Low quiescent current |
| Medium | SW1: Vga1 SW2: Vgb2 | Class AB | Class C | Medium quiescent current |
| High | SW1: Vga1 SW2: Vgb1 | Class AB | Class AB | High output power with better linearity |

When the input power is low switch SW1 is set to Vga2 and switch SW2 is set to Vga1. In this condition FET A works at class C and FET B works at class AB. As the output power is not high enough to trn ON FET A (the class C FET) only FET B (class AB FET) is operational. FET A is OFF at low output power levels. In this condition there is no power consumption by FET A and the total current consumption for the amplifier stage is reduced to the level of FET B. As a result of this higher efficiency for the power amplifier stage can be obtained at higher output levels.

When the output power is medium the switch SW1 is set to Vga1 and switch SW2 set to Vgb2. Therefore FET A works at class AB and FET B works at class C. As the gate width of FET A is wider than that of FET B, FET A is used to deliver higher output power at medium power levels. Again the current consumption for the amplifier stage is reduced to the level of the current consumption of FET A.

When the input power is HIGH switch SW1 is set to Vga1 and switch SW2 is set to Vgb1. At this time FET A works at class AB and FET B also works at class AB. Both FET's are biased at AB to deliver high power output with better linearity compared with the FET's biased at class C.

From the above it will be appreciated that:
1. Class AB plus C amplifier has a higher output power than class AB amplifier at the same linearity.
2. At high output power levels the class AB plus C power amplifier has better linearity than a class AB amplifier with the same current consumption at the same output power level. This means that the class AB plus C amplifier has improvement in linearity without sacrificing efficiency.

3. At low output power levels the class AB plus C amplifier consumes less current than the class AB amplifier and the result that the class AB plus C amplifier achieves higher efficiency than a class AB amplifier at low output levels.

The embodiment of the invention which has been described makes use of FET's and has been implemented making use of MMIC technology. It will be appreciated that this is simply by way of example and that other forms of circuitry may be used for example bi-polar junction transistors or indeed any other form of transistor. Again it will be appreciated that technologies other than MMIC (e.g. discrete components) may be utilised to achieve the particular arrangements disclosed within the specification.

It will be further appreciated that although the amplifier stage having a plurality of amplifiers has been described as the last in the cascaded amplifier it may be placed anywhere in the chain.

References

[1] Snug-Jae Maeng, et al, "A GaAs Power Amplifier for 3.3 V CDMA/AMPS Dual-Mode Cellular Phones" IEEE-MTT, Vol 43, No. 12, December 1995, pp 22839–2843.

[2] H. Yamada, S. Ohara, T. Iwai, T. Tamaguchi, K Imanishi and K Joshin, "Self-linearising Technique for L-Band HBT power amplifier. Effect of source impedance on phase distortion", IEEE Trans Microwave Theory and Tech., Vol MTT-40, No 12, pp. 2398–2402, 1996.

[3] T. B. Nishimura, N. Iwata, K. Yamaguchi, K. Takemura and Y. Miyasaka, "3.5 V operation driver-amplifier MMIC utilizing SrTi03 capacitors for 1.95 GHz wide-band CDMA cellular phones", IEEEE, MTT-S International Microwave Conference, pp 447–450, 1998/.

[4] K. Yamammoto, N. Tamino, I. Umemoto, "Power amplifier including an impedance matching circuit and a switch FET", U.S. Pat. No. 5,548,246, May 1995.

[5] T. Sato, S Yuyama, A. Nakajima, H. Ono, A. Iwai, E. Hase, C. Kusana, "Intelligent RF power module for PCS CDMA applications", IEEE MTT-S International Microwave Conference, pp 201–204, 1998.

What is claimed is:

1. A power amplifier having an input terminal for receiving an input signal to be amplified and an output terminal to which the amplified signal is passed, the power amplifier comprising a plurality of cascaded amplifier stages one of which comprises a plurality of amplifiers connected in parallel with their input ports interconnected and their output ports interconnected; and said plurality of amplifiers connected in parallel defining at least a class AB amplifier and a class C amplifier, wherein if the power level of the input signal is below a predetermined input signal, then the class AB amplifier alone is operational and if the power level of the input signal transitions above the predetermined input signal, then both the class AB and class C amplifiers are operational.

2. An amplifier as claimed in claim 1, wherein said one stage is the last stage in said plurality of cascaded amplifier stages.

3. An amplifier as claimed in claim 1, wherein said one stage comprises two or more amplifiers at least one of which is biased at class AB and at least another of which may be switchably biased at class AB or class C.

4. An amplifier as claimed in claim 3, arranged such that the amplifier with switchable bias is biased at class C when the power level of the input signal is low, and at class AB when the power level of the input signal is high.

5. An amplifier as claimed in claim 1, wherein said one stage comprises two or more amplifiers each of which may be switchably biased at class AB or class C and the gates of widths of which are different.

6. An amplifier as claimed in claim 5 arranged such that the FET with a smaller gate width is biased at class AB and the other at class C when the input power is low, but the amplifier who's FET with a larger gate width is biased at class AB and the others are biased at class C when the input power level is medium and in which all the amplifiers are biased to class AB when the input power level is HIGH.

7. An amplifier as claimed in claim 2, wherein the amplifiers in said one stage comprise different threshold voltage biased field effect transistors having the same gate bias voltages.

8. An amplifier as claimed in claim 1, wherein said amplifier stages are formed of bipolar junction transistors.

9. An amplifier as claimed in claim 1, wherein said amplifier stages are formed of field effect transistors.

10. An amplifier as claimed in claim 1 including means enabling the power to be divided to the input to each amplifier in said one stage.

11. An amplifier as claimed in claim 1 including means enabling the outputs of each of said amplifiers to be combined.

12. An amplifier as claimed in claim 1 wherein there is provided between the power dividing point to the input of each of said amplifiers and matching circuit means enabling phase shifting to compensate for the amplitude a phase response of each of said amplifiers.

13. An amplifier as claimed in claim 1 wherein in said final stage there is provided between the output port of each of said amplifiers and the combining point a matching circuit means enabling phase shifting to compensate for the amplitude and phase response of each of said amplifiers.

14. A power amplifier having an input terminal for receiving a signal to be amplified and an output terminal to which the amplified signal is passed, and which comprises a plurality of amplifiers connected in parallel with their input ports interconnected and their output ports interconnected;

wherein said plurality of amplifiers connected in parallel includes a first amplifier and a second amplifier; and wherein the first amplifier alone is operational when the input signal is below a predetermined level, and both the first and second amplifiers are operational when the signal is above the predetermined level.

15. An amplifier as claimed in claim 14, wherein there are provided two or more amplifiers at least one of which is biased at class AB and at least another of which is biased at class C.

16. An amplifier as claimed in claim 15, arranged such that when the power level of the input signal is low the class AB amplifier alone is operational and when the power level of the input signal becomes high both the class AB and class C amplifiers are operational.

17. An amplifier as claimed in claim 14, wherein there are provided two or more amplifiers at least one of which is biased at class AB and at least another of which may be switchably biased at class AB or class C.

18. An amplifier as claimed in claim 17, arranged such that the amplifier with switchable bias is biased at class C when the power level of the input signal is low, and at class AB when the power level of the input signal is high.

19. An amplifier as claimed in claim 14, wherein there are provided two or more amplifiers each of which may be switchably biased at class AB or class C and the gates widths of which are different.

20. An amplifier as claimed in claim 19 arranged such that the FET with a smaller gate width is biased at class AB and the other at class C when the input power is low, but the amplifier who's FET with a wider gate is biased at class AB and the others are biased at class C when the input power level is medium and in which all the amplifiers are biased to class AB when the input power level is HIGH.

21. An amplifier as claimed in claim 14, wherein the amplifiers comprise different threshold voltage field effect transistors having the same gate bias voltages.

22. A power amplifier as claimed in claim 14 wherein said amplifiers are formed of bipolar junction transistors.

23. An amplifier as claimed in claim 14, wherein said amplifiers are formed of FETs.

24. An amplifier as claimed in claim 14, including means enabling the power to be divided to the input to each amplifier and means enabling the outputs of each of said amplifiers to be combined.

25. An amplifier as claimed in claim 14, wherein there is provided between the power dividing point to the input of each of said amplifiers and matching circuit means enabling phase shifting to compensate for the amplitude and phase response of each of said amplifiers.

26. An amplifier as claimed in claim 14, wherein there is provided between the output ports of each of said amplifiers and the combining point a matching circuit enabling phase shifting to compensate for the amplitude and phase response of each of said amplifiers.

27. An amplifier according to claim 14, wherein the first amplifier is class AB and the second amplifier is class C.

28. A method for amplifying a signal comprising the steps of:
   biasing a first amplifier at a predetermined level;
   biasing a second amplifier at a level that is different from the predetermined level of the first amplifier;
   coupling the first and second amplifiers in parallel; and
   applying an input signal to the first and second amplifiers coupled in parallel, wherein the first amplifier alone is substantially operational when the input signal is below a predetermined level and the first and the second amplifiers are both substantially operational when the input signal is above the predetermined level.

29. A method according to claim 27, wherein the first amplifier is a class AB amplifier.

30. A method according to claim 27; wherein the second amplifier is a class C amplifier.

31. A method according to claim 27, wherein the gate voltage for the first amplifier is set to a value higher than its pinch off voltage.

32. A method according to claim 27, wherein the gate voltage for the second amplifier is set to a value lower than its pinch-off voltage.

* * * * *

UNITED STATES PATENT AND TRADEMARK OFFICE
CERTIFICATE OF CORRECTION

PATENT NO. : 6,204,731 B1  
DATED : March 20, 2001  
INVENTOR(S) : Cao Jiang et al.

Page 1 of 1

It is certified that error appears in the above-identified patent and that said Letters Patent is hereby corrected as shown below:

Title page,
Between Items [76] and (*) insert the following:

-- [73] Assignee: Institute of Microelectronics, Singapore (SA) --.

Signed and Sealed this

Nineteenth Day of February, 2002

Attest:

Attesting Officer

JAMES E. ROGAN
*Director of the United States Patent and Trademark Office*